United States Patent
Enomoto

(10) Patent No.: US 9,786,772 B2
(45) Date of Patent: Oct. 10, 2017

(54) SEMICONDUCTOR DEVICE AND METHOD FOR MANUFACTURING THE SAME

(71) Applicant: ROHM CO., LTD., Kyoto-shi, Kyoto (JP)

(72) Inventor: Yu Enomoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/402,699

(22) Filed: Jan. 10, 2017

(65) Prior Publication Data

US 2017/0207330 A1 Jul. 20, 2017

(30) Foreign Application Priority Data

Jan. 15, 2016 (JP) .................... 2016-006575

(51) Int. Cl.
*H01L 29/66* (2006.01)
*H01L 29/739* (2006.01)
(Continued)

(52) U.S. Cl.
CPC ........ *H01L 29/7397* (2013.01); *H01L 21/268* (2013.01); *H01L 21/2636* (2013.01);
(Continued)

(58) Field of Classification Search
USPC ................. 257/135–136, 242, 329, E27.091, 257/E27.095–E27.096, E29.118, E29.274, 257/E29.313, E29.318, E29.262, E21.41, 257/E21.629, E21.643, E27.052, E27.079, 257/E29.036–E29.038, E29.046–E29.048, 257/E29.115, E29.196, E29.211–E29.225, 257/E21.371, E21.387, E21.403–E21.407, 257/E21.441, E21.445, E21.448–E21.452; 438/136, 137, 156, 173, 192, 206, 212
See application file for complete search history.

(56) References Cited

U.S. PATENT DOCUMENTS

2009/0289278 A1* 11/2009 Torii .................... H01L 29/0834
257/139
2010/0327313 A1* 12/2010 Nakamura .......... H01L 29/0834
257/133

FOREIGN PATENT DOCUMENTS

JP 2013145903 7/2013

\* cited by examiner

*Primary Examiner* — Tram H Nguyen
(74) *Attorney, Agent, or Firm* — Hamre, Schumann, Mueller & Larson, P.C.

(57) ABSTRACT

A semiconductor device according to the present invention includes a semiconductor substrate, having an emitter layer of a first conductivity type, a collector layer of a second conductivity type and a drift layer of the first conductivity type sandwiched therebetween, the emitter layer disposed at a front surface side of the semiconductor substrate and the collector layer disposed at a rear surface side of the semiconductor substrate, a base layer of the second conductivity type between the drift layer and the emitter layer, a buffer layer of the first conductivity type between the collector layer and the drift layer, the buffer layer having an impurity concentration higher than that of the drift layer, and having an impurity concentration profile with two peaks in regard to a depth direction from the rear surface of the semiconductor substrate, and a defect layer, formed in the drift layer and having an impurity concentration profile with a half-value width of not more than 2 μm in regard to the depth direction from the rear surface of the semiconductor substrate.

17 Claims, 10 Drawing Sheets

(51) Int. Cl.
*H01L 29/10* (2006.01)
*H01L 29/423* (2006.01)
*H01L 29/167* (2006.01)
*H01L 21/265* (2006.01)
*H01L 21/268* (2006.01)
*H01L 21/263* (2006.01)

(52) U.S. Cl.
CPC .... *H01L 21/26513* (2013.01); *H01L 29/1095* (2013.01); *H01L 29/167* (2013.01); *H01L 29/4236* (2013.01); *H01L 29/66333* (2013.01)

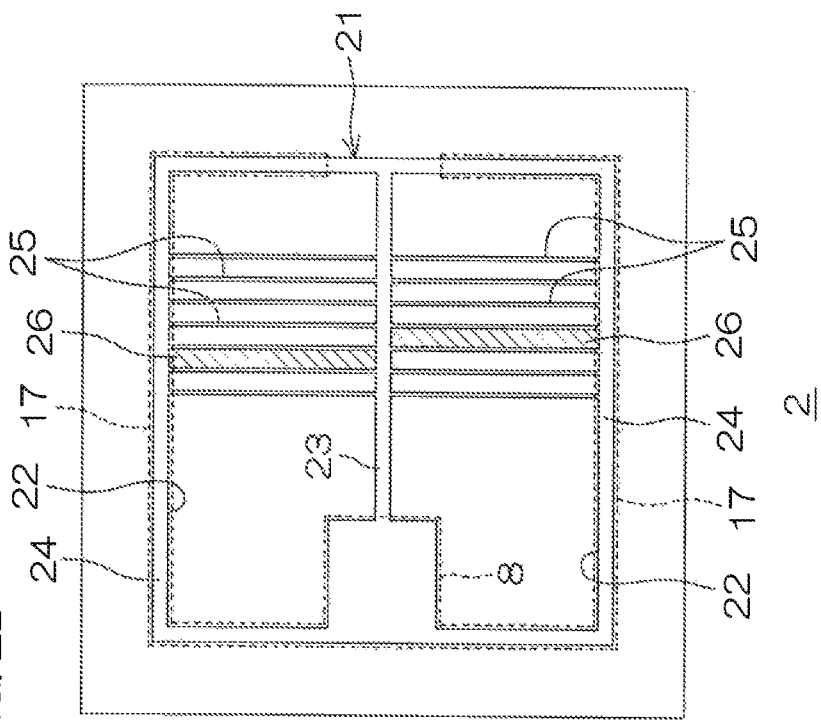
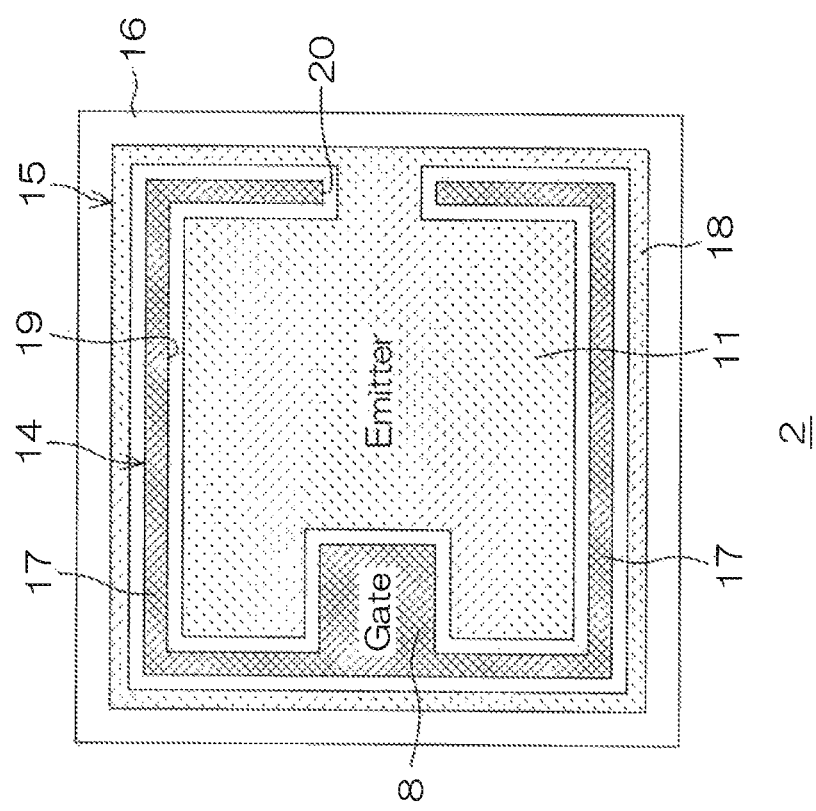
FIG. 2A
FIG. 2B (Reference Example 2)

(Example 1)

(Reference Example 3)

(Reference Example 1)

SEMICONDUCTOR DEVICE AND METHOD FOR MANUFACTURING THE SAME

CROSS-REFERENCE TO RELATED APPLICATIONS

The present application corresponds to Japanese Patent Application No. 2016-006575 filed in the Japan Patent Office on Jan. 15, 2016, and the entire disclosure of this application is incorporated herein by reference.

TECHNICAL FIELD

The present invention relates to a semiconductor device, which includes an IGBT (Insulated Gate Bipolar Transistor), and a method for manufacturing the same.

BACKGROUND ART

The IGBT is known as a semiconductor device used in a power conversion device, such as a converter, inverter, etc. (see, for example, Japanese Patent Application Publication No. 2013-145903).

SUMMARY OF INVENTION

Characteristics of the IGBT include VCE(sat) (collector-emitter saturation voltage) and switching power loss. Although with both of these, the lower the more preferable, there is presently still much room for improvement.

An object of the present invention is to provide a semiconductor device and a method for manufacturing the same, with which the VCE(sat) and the power loss can be reduce in comparison to the conventional art.

BRIEF DESCRIPTION OF DRAWINGS

FIG. 2A is a schematic plan view of a switching element chip of FIG. 1A and FIG. 1B.

FIG. 2B is a diagram of an internal structure of the switching element chip.

DESCRIPTION OF EMBODIMENTS

Figure 1A:
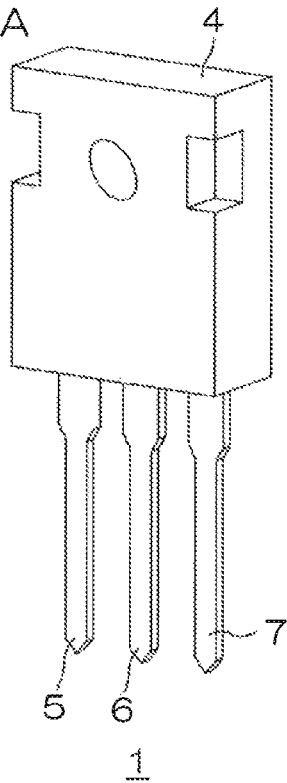
FIG. 1A is a schematic external view of a semiconductor device according to a preferred embodiment of the present invention.

A semiconductor device according to a preferred embodiment of the present invention includes a semiconductor substrate, having an emitter layer of a first conductivity type, a collector layer of a second conductivity type and a drift layer of the first conductivity type sandwiched therebetween, the emitter layer disposed at a front surface side of the semiconductor substrate and the collector layer disposed at a rear surface side of the semiconductor substrate, a base layer of the second conductivity type between the drift layer and the emitter layer, a buffer layer of the first conductivity type between the collector layer and the drift layer, the buffer layer having an impurity concentration higher than that of the drift layer, and having an impurity concentration profile with two peaks in regard to a depth direction from the rear surface of the semiconductor substrate, and a defect layer, formed in the drift layer and having an impurity concentration profile with a half-value width of not more than 2 μm in regard to the depth direction from the rear surface of the semiconductor substrate.

With the semiconductor device having the above arrangement, a semiconductor device of low VCE (sat) and low power loss that have not been achieved conventionally can be provided.

The defect layer may contain at least one type of element among $^4$He, $^3$He, H, P, F, Ar, As, Sb, and Si. In this case, the semiconductor device may, for example, be manufactured by a method for manufacturing a semiconductor device that includes a process of forming the base layer of the second conductivity type on a front surface portion of the semiconductor substrate of the first conductivity type having the drift layer and forming the emitter layer of the first conductivity type on a front surface portion of the base layer, a process of forming the buffer layer, having the impurity concentration higher than that of the drift layer and having the impurity concentration profile with two peaks in regard to the depth direction from the rear surface of the semiconductor substrate, by implanting, from the rear surface of the semiconductor substrate, a first conductivity type impurity with a first energy and then implanting the first conductivity type impurity with a second energy differing from the first energy, a process of forming the collector layer at the rear surface side of the semiconductor with respect to the buffer layer by implanting a second conductivity type impurity from the rear surface of the semiconductor substrate, and a process of forming, in the drift layer, the defect layer, having the impurity concentration profile with the half-value width of not more than 2 μm in regard to the depth direction from the rear surface of the semiconductor substrate, by irradiating the rear surface of the semiconductor substrate with particles of at least one type among $^4$He, $^3$He, H, P, F, Ar, As, Sb, and Si and performing annealing processing of the semiconductor substrate.

In the method for manufacturing the semiconductor device, the first energy may be higher than the second energy. That is, a relatively deep peak may be formed first and a peak relatively shallower than that peak may be formed thereafter.

Also preferably, the method for manufacturing the semiconductor device includes a first annealing processing process of activating the impurities inside the buffer layer and the collector layer after the forming of the collector layer, and the annealing processing when forming the defect layer includes a second annealing processing process of annealing-processing the semiconductor substrate at a lower temperature than that during the first annealing processing process. In this case, the first annealing processing process may include a first laser annealing process by laser irradiation having a first energy density, and the second annealing processing process may include a second laser annealing process by laser irradiation having a second energy density lower than the first energy density. More specifically, the first energy density may be 1 J/cm² to 3 J/cm² and the second energy density may be 0.1 J/cm² to 0.5 J/cm².

The defect layer can be formed satisfactorily by performing the second annealing processing process at the lower temperature than that of the first annealing processing process.

Also, in the method for manufacturing the semiconductor device, the particles may be irradiated by an ion implantation apparatus, a cyclotron, or a Van de Graaf generator.

Also, the semiconductor device according to the preferred embodiment of the present invention may have the following features.

Specifically, the defect layer may be formed between 1 μm to 3 μm from the rear surface of the semiconductor substrate.

The impurity concentration profile of the buffer layer may have a first peak in a relatively shallow region from the rear surface of the semiconductor substrate and have a second peak of a lower impurity concentration than that of the first peak in a region relatively deeper than the first peak.

The impurity concentration of the first peak may be $2 \times 10^{16}$ cm$^{-3}$ to $2 \times 10^{18}$ cm$^{-3}$ and the impurity concentration of the second peak may be $6 \times 10^{15}$ cm$^{-3}$ to $6 \times 10^{17}$ cm$^{-3}$.

The semiconductor substrate may have a thickness of 40 μm to 200 μm.

The semiconductor device may include a gate trench, penetrating through the emitter layer and the base layer from the front surface of the semiconductor substrate and reaching the drift layer, and a gate electrode, embedded in the gate trench across a gate insulating film formed on an inner surface of the gate trench. That is, a trench gate type IGBT may be included. Obviously, the semiconductor device may include a planar gate type IGBT.

The gate trenches may be formed in plurality at a pitch of 2 μm to 7 μm and each may have a depth of 2 μm to 6 μm.

The drift layer may include an enhanced layer, formed directly below the base layer and having a relatively higher impurity concentration than that of other regions of the drift layer.

The semiconductor substrate may include a silicon substrate.

Each of the drift layer, the emitter layer, the collector layer, the base layer, the defect layer, and the enhanced layer is not restricted to that which is formed to a layer form having a clear boundary with respect to a periphery thereof and may be a certain region occupying a portion of the semiconductor substrate.

A preferred embodiment of the present invention shall now be described in detail with reference to the attached drawings.

Figure 1B:
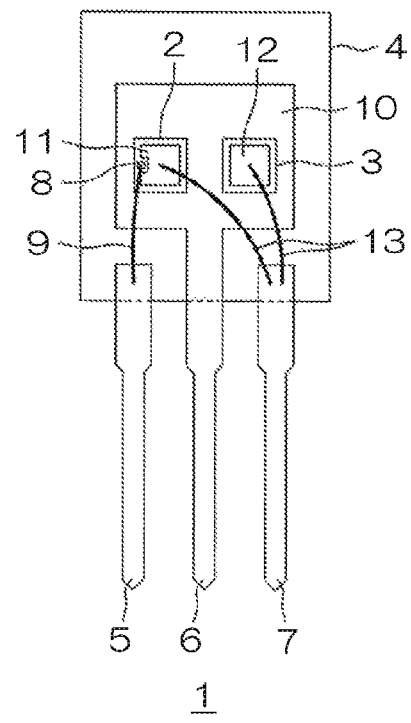
FIG. 1B is a diagram of an internal structure of the semiconductor device.

FIG. 1A is a schematic external view of a semiconductor device 1 according to the preferred embodiment of the present invention and FIG. 1B is a diagram of an internal structure of the semiconductor device 1.

As shown in FIG. 1A and FIG. 1B, the semiconductor device 1 has a structure, which includes a switching element chip 2 (IGBT) and a diode chip 3 and with which these are sealed by a resin package 4. The semiconductor device 1 further includes three terminals 5 to 7 electrically connected to the two chips 2 and 3.

The three terminals 5 to 7 include a gate terminal 5, a collector terminal 6, and an emitter terminal 7.

The gate terminal 5 is connected to a gate pad 8 of the switching element chip 2 via a bonding wire 9.

The collector terminal 6 has an island 10, bonded to respective rear surfaces of the switching element chip 2 and the diode chip 3, and is directly connected to a collector (a collector metal 42 to be described below) of the switching element chip 2 and a cathode (not shown) of the diode chip 3.

The emitter terminal 7 is connected via bonding wires 13 to an emitter pad 11 of the switching element chip 2 and an anode pad 12 of the diode chip 3.

The collector terminal 6 and the emitter terminal 7 respectively serve as terminals for the cathode and an anode of the diode chip 3, and the switching element chip 2 and the diode chip 3 are thereby connected mutually in parallel.

The three terminals 5 to 7 are aligned and extend parallel to each other from one side surface of the resin package 4 that is formed to a substantially rectangular parallelepiped shape.

FIG. 2A is a schematic plan view of the switching element chip 2 of FIG. 1A and FIG. 1B and mainly shows a pad layout of the switching element chip 2.

First, as shown in FIG. 2A, a gate metal 14 and an emitter metal 15, which are made, for example, of aluminum (AlSiCu, AlCu, etc.), are formed on a frontmost surface of the switching element chip 2. The gate metal 14 and the emitter metal 15 are selectively covered by a passivation film 16.

A portion of the gate metal 14 exposed from the passivation film 16 includes a gate pad 8 and gate fingers 17. The gate fingers 17 extend from the gate pad 8 and along a peripheral edge of the switching element chip 2 across substantially an entire periphery of the peripheral edge. In the present preferred embodiment, a pair of the gate fingers 17 are formed to shapes symmetrical with respect to the gate pad 8.

On the other hand, a portion of the emitter metal 15 exposed from the passivation film 16 includes an emitter pad 11 and an emitter outer peripheral portion 18. The emitter pad 11 is disposed in a central region 19 of the switching element chip 2 that is surrounded by an integral annular portion of the gate pad 8 and the gate fingers 17. The emitter outer peripheral portion 18 extends out from the central region 19 to a peripheral edge of the switching element chip 2 via a space 20 between tips of the pair of gate fingers 17 and branches in two directions from the peripheral edge to be oriented along each of the pair of gate fingers 17. The emitter outer peripheral portion 18 surrounds entire peripheries of the gate pad 8 and the gate fingers 17.

FIG. 2B is a diagram of an internal structure of the switching element chip 2 and mainly shows a layout of gate electrodes 25 of the switching element chip 2. A portion indicated by broken lines in FIG. 2B is the integral annular portion of the gate pad 8 and the gate fingers 17 shown in FIG. 2A described above.

As shown in FIG. 2B, in an interior of the switching element chip 2, a gate embedding portion 21, made, for example, of polysilicon, is formed directly below the gate pad 8 and the gate fingers 17.

The gate embedding portion 21 includes a main wire portion 23 dividing a region 22 directly below the central region 19 into two regions, a peripheral wire portion 24 surrounding the region 22, and the gate electrodes 25 connecting the main wire portion 23 and the peripheral wire portion 24. Specifically, the main wire portion 23 is formed so as to connect opposite sides of the peripheral wire portion 24 of rectangular shape in a plan view to each other.

Multiple gate electrodes 25 are formed in stripes parallel to the opposite sides (only a portion is shown in FIG. 2B). Each gate electrode 25 has one end portion connected to the main wire portion 23 and another end portion connected to the peripheral wire portion 24. Such gate electrodes 25 of stripe form are formed in the region 22 at both sides across the main wire portion 23, and unit cells 26 are each demarcated in a portion surrounded by mutually adjacent gate electrodes 25 and the main wire portion 23 and the peripheral wire portion 24 that connect end portions of the electrodes to each other (hatched portions in FIG. 2B).

A voltage input into the gate pad 8 is applied to the gate electrodes 25 via the gate fingers 17, the peripheral wire portion 24 directly therebelow, and the main wire portion 23. Although with the present preferred embodiment, only portions formed at both sides of each unit cell 26 are referred to as the gate electrodes 25, an entirety of the gate embedding portion 21 or the gate embedding portion 21 and the gate metal 14 together may be referred to as a gate electrode.

Figure 3A:
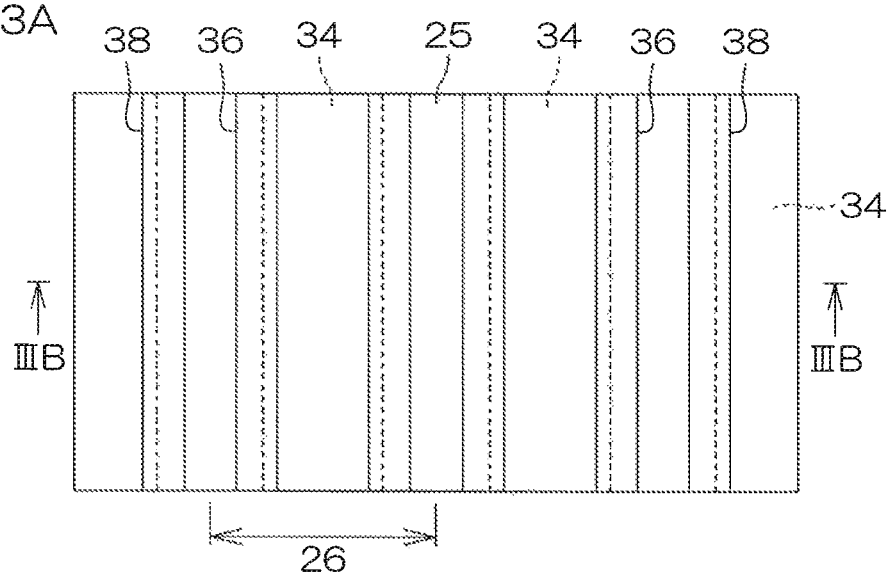
FIG. 3A is a plan view for describing a principal portion of the switching element chip of FIG. 2A in more detail.
Figure 3B:
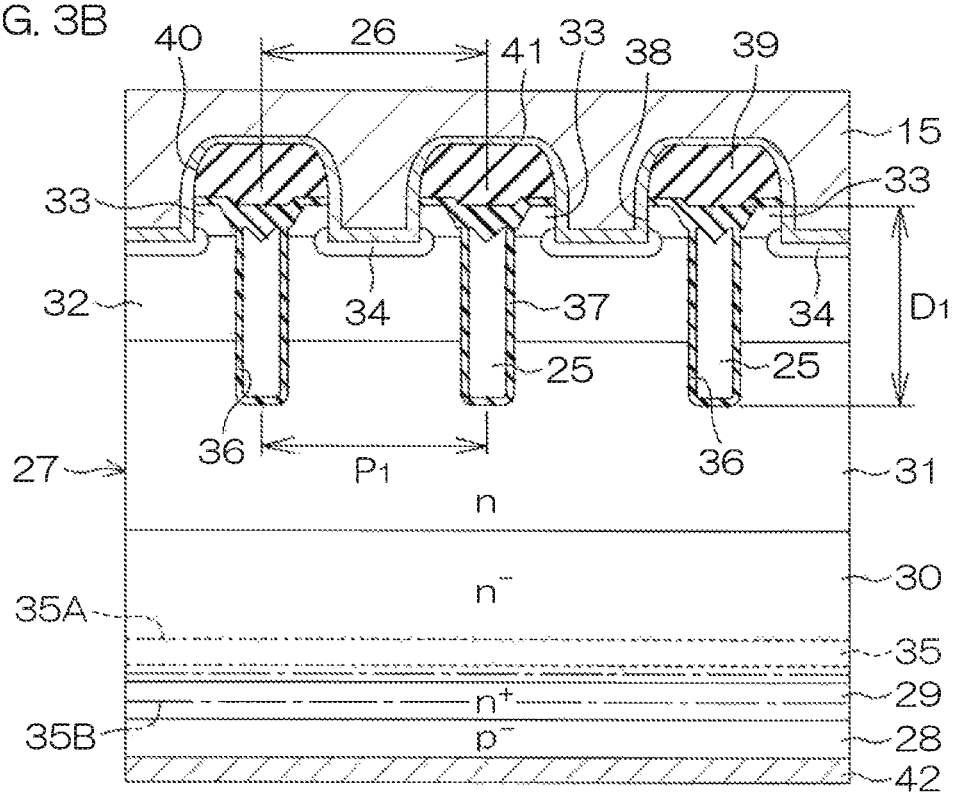
FIG. 3B is a sectional view taken along line IIIB-IIIB in FIG. 3A.

FIG. 3A is a plan view for describing a principal portion of the switching element chip 2 of FIG. 2A in more detail, and FIG. 3B is a sectional view taken along line IIIB-IIIB in FIG. 3A.

The switching element chip 2 is an n channel type IGBT and includes a semiconductor substrate 27. The semiconductor substrate 27 has, for example, a thickness of 40 μm to 200 μm (60 μm as one example).

The semiconductor substrate 27 includes a $p^-$ type collector layer 28, an $n^+$ type buffer layer 29, an $n^-$ type drift layer 30, an n type enhanced layer 31, a $p^-$ type base layer 32, $n^+$ type emitter layers 33, $p^+$ type base contact layers 34, and a defect layer 35.

The $p^-$ type collector layer 28, the $p^-$ type base layer 32, and the $p^+$ type base contact layers 34 are semiconductor layers doped with a p type impurity. More specifically, these may be semiconductor layers formed by ion-implanting a p type impurity into the $n^-$ type semiconductor substrate 27. As the p type impurity, B (boron), Al (aluminum), Ga (gallium), etc., may be applied.

An impurity concentration of the $p^-$ type collector layer 28 may, for example, be $1\times10^{16}$ cm$^{-3}$ to $1\times10^{20}$ cm$^{-3}$. An impurity concentration of the $p^-$ type base layer 32 may, for example, be $2\times10^{16}$ cm$^{-3}$ to $2\times10^{18}$ cm$^{-3}$. An impurity concentration of the $p^+$ type base contact layers 34 may, for example, be $3\times10^{18}$ cm$^{-3}$ to $3\times10^{20}$ cm$^{-3}$.

On the other hand, the $n^+$ type buffer layer 29, the $n^-$ type drift layer 30, the n type enhanced layer 31, and the $n^+$ type emitter layers 33 are semiconductor layers doped with an n type impurity. More specifically, the $n^-$ type drift layer 30 may be a semiconductor layer with which an impurity concentration of the $n^-$ type semiconductor substrate 27 is kept, and the $n^+$ type buffer layer 29, the n type enhanced layer 31, and the $n^+$ type emitter layers 33 may be semiconductor layers formed by ion-implanting an n type impurity further into the $n^-$ type semiconductor substrate 27. As the n type impurity, P (phosphorus), As (arsenic), Sb (antimony), etc., may be used.

An impurity concentration of the $n^-$ type drift layer 30 may, for example, be $2\times10^{13}$ cm$^{-3}$ to $2\times10^{15}$ cm$^{-3}$. An impurity concentration of the n type enhanced layer 31 may, for example, be $5\times10^{14}$ cm$^{-3}$ to $5\times10^{16}$ cm$^{-3}$. An impurity concentration of the $n^+$ type emitter layers 33 may, for example, be $2\times10^{19}$ cm$^{-3}$ to $2\times10^{21}$ cm$^{-3}$. An impurity concentration of the $n^+$ type buffer layer 29 shall be described in detail later by using FIG. 4.

A positional configuration of the respective impurity layers shall now be described. A large portion of the semiconductor substrate 27 is the $n^-$ type drift layer 30. For example, with the semiconductor substrate 27 of 60 μm thickness, its central portion of approximately 55 μm thickness excluding a front surface portion and a rear surface portion is the $n^-$ type drift layer 30.

The $p^-$ type base layer 32 is disposed at a front surface side of the semiconductor substrate 27 with respect to the $n^-$ type drift layer 30, and the $n^+$ type emitter layers 33 are further disposed at front surface portions of the $p^-$ type base layer 32. The $n^+$ type emitter layers 33 form a front surface of the semiconductor substrate 27. Also, gate trenches 36 are formed so as to penetrate through the $n^+$ type emitter layers 33 and the $p^-$ type base layer 32 from the front surface of the semiconductor substrate 27 to reach the $n^-$ type drift layer 30. Of the $n^-$ type drift layer 30, a portion covering lower portions of the gate trenches 36 is the n type enhanced layer 31 having an impurity concentration relatively higher than that of other regions ($n^-$ type regions) of the $n^-$ type drift layer 30. That is, the n type enhanced layer 31 is formed directly under an entirety of the $p^-$ type base layer 32 so as to contact the $p^-$ type base layer 32 and forms lower inner surfaces of the gate trenches 36.

On the other hand, the $p^-$ type collector layer 28 is disposed at a rear surface portion of the semiconductor substrate 27 with respect to the $n^-$ type drift layer 30. The $p^-$ type collector layer 28 forms a rear surface of the semiconductor substrate 27. Further, the $n^+$ type buffer layer 29 is disposed between the $p^-$ type collector layer 28 and the $n^-$ type drift layer 30.

As shown in FIG. 3A, the gate trenches 36 are formed in stripes in a plan view. A pitch $P_1$ of the gate trenches 36 of stripe form is, for example, 2 μm to 7 μm. Also, each gate trench 36 has a depth $D_1$ of 2 μm to 6 μm. Each gate trench 36 has a gate electrode 25 embedded therein across a gate insulating film 37, made, for example, of silicon oxide, etc. As also shown in FIG. 2B, the gate trenches 36 and the gate electrodes 25 demarcate the unit cells 26 of stripe form in the semiconductor substrate 27. The gate trenches 36 are not restricted to the stripe form illustrated in the present preferred embodiment and may be formed, for example, in a lattice (quadrilateral lattice, hexagonal lattice, etc.) or a zigzag lattice.

A contract trench 38 is formed at substantially a center in a width direction of each unit cell 26. The contact trench 38 is shallower than a gate trench 36 and penetrates through the corresponding $n^+$ type emitter layer 33 from the front surface of the semiconductor substrate 27, and a bottom portion thereof is positioned in the $p^-$ type base layer 32. The $p^+$ type base contact layer 34 is formed at the bottom portion of the contact trench 38.

An interlayer insulating film 39, made, for example, of silicon oxide (SiO$_2$), is formed on the front surface of the semiconductor substrate 27. The interlayer insulating film 39 has contact holes 40 in communication with the contact trenches 38.

An emitter metal 15 is formed above the interlayer insulating film 39 across a barrier metal 41, made, for example, of Ti/TiN. The emitter metal 15 is connected, via the contact holes 40 and the contact trenches 38, to the $p^+$ type base contact layers 34.

A collector metal 42, made, for example, of aluminum (AlSiCu, AlCu, etc.), is formed on the rear surface of the semiconductor substrate 27. The collector metal 42 is connected to the p⁻ type collector layer 28.

Figure 4:
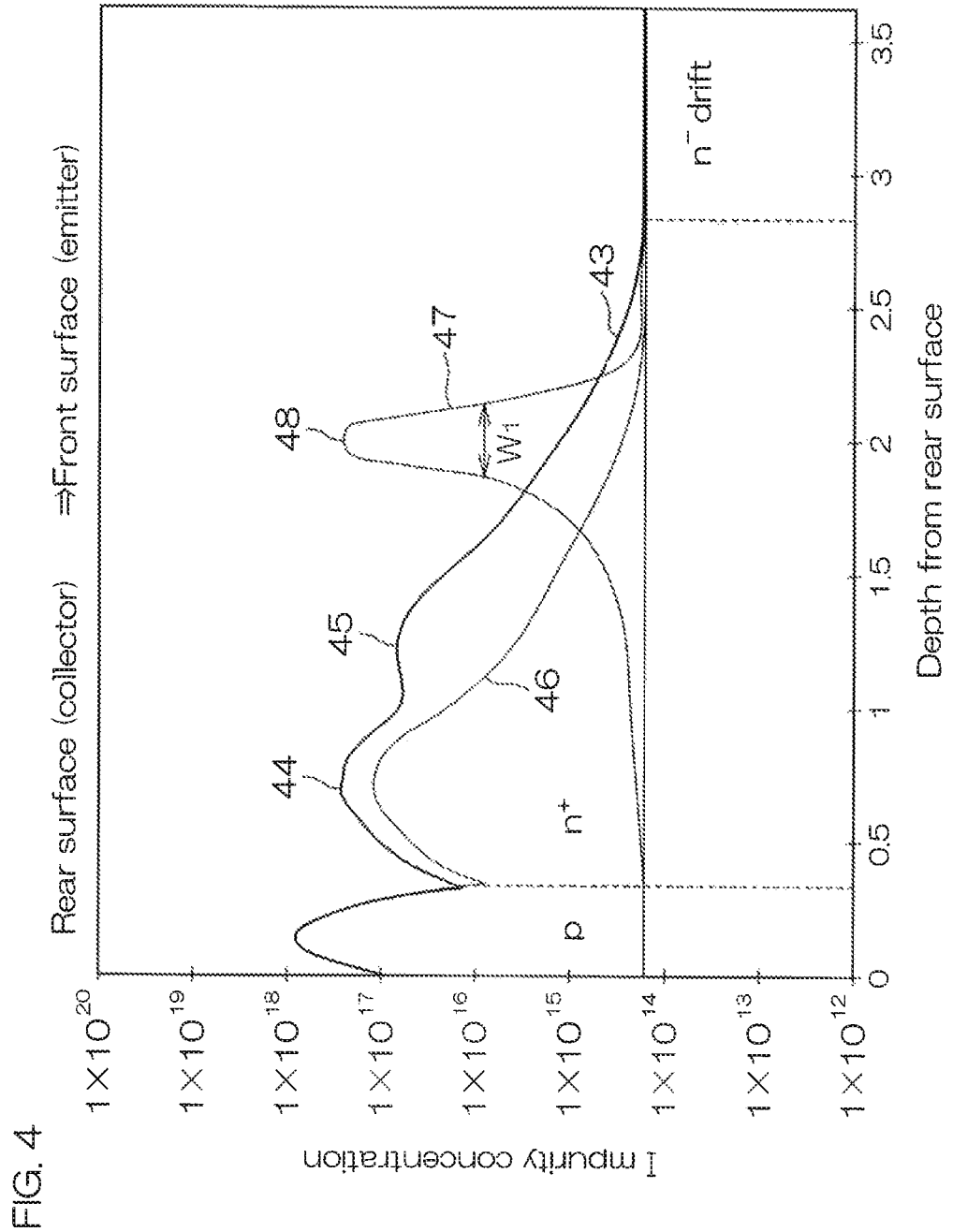
FIG. 4 is a diagram for describing impurity concentrations of a buffer layer and a defect layer.

FIG. 4 is a diagram for describing the impurity concentrations of the n⁺ type buffer layer 29 and the defect layer 35. An impurity concentration profile of a buffer layer having only one peak is also shown for comparison in FIG. 4. Forming positions, impurity concentrations, etc., of the n⁺ type buffer layer 29 and the defect layer 35 shall now be described with reference to FIG. 4 in addition to FIG. 3B.

First, as shown in FIG. 3B, the n⁺ type buffer layer 29 is formed so as to contact the p⁻ type collector layer 28, and has a higher impurity concentration than that of the n⁻ type drift layer 30 across its entirety. As shown in FIG. 4, whereas the impurity concentration of the n⁻ type drift layer 30 is substantially fixed at approximately $2 \times 10^{14}$ cm$^{-3}$, the impurity concentration of the n⁺ type buffer layer 29 is higher. More specifically, the n⁺ type buffer layer 29 has an impurity concentration profile 43 having two peaks in regard to a depth direction from the rear surface of the semiconductor substrate 27 (direction from left to right in FIG. 4). The profile 43 has a first peak 44, in a relatively shallow region (region of 0.5 μm to 1 μm in FIG. 4) from the rear surface of the semiconductor substrate 27, and a second peak 45 of a lower impurity concentration than that of the first peak 44 in a region relatively deeper (1 μm to 1.5 μm in FIG. 4) than the first peak 44. For example, the impurity concentration of the first peak 44 is $2 \times 10^{16}$ cm$^{-3}$ to $2 \times 10^{18}$ cm$^{-3}$ and the impurity concentration of the second peak 45 is $6 \times 10^{15}$ cm$^{-3}$ to $6 \times 10^{17}$ cm$^{-3}$. A greater withstand voltage can thereby be maintained, for example, in comparison to a case where the buffer layer, having a comparative profile 46 having only one peak at substantially the same depth as the first peak 44, is formed. The semiconductor substrate 27 of approximately 60 μm thickness can thereby be imparted with a sufficient withstand voltage.

Next, as shown in FIG. 3B, the defect layer 35 is formed locally inside the n⁻ type drift layer 30 so as to spread at a position of preset depth from the rear surface of the semiconductor substrate 27. The defect layer 35 may be formed directly above and separated from the n⁺ type buffer layer 29 as indicated by reference symbol 35A in FIG. 3B, or may be formed to overlap partially with the n⁺ type buffer layer 29 as indicated by reference symbol 35B. In the present preferred embodiment, it is formed to be separated from the n⁺ type buffer layer 29 at 1 μm to 3 μm from the rear surface of the semiconductor substrate 27.

The defect layer 35 is a region formed by irradiating particles of at least one type of element among ⁴He, ³He, H, P, F, Ar, As, Sb, and Si and further activating the particles by heat treatment and is a region in which crystal defects occur in a portion due to the irradiation of the particles. Among the above particles, those of ⁴He and ³He are high in heat resistance, small in change due to temperature, and therefor enable change of the defect layer 35 due to thermal stress to be suppressed during assembly by incorporation of the semiconductor device 1 in a package.

Also, the defect layer 35 has an impurity concentration profile 47 with a half-value width (full width at half maximum) $w_1$ of not more than 2 μm in regard to the depth direction from the rear surface of the semiconductor substrate 27 as shown in FIG. 4. In the present preferred embodiment, the profile 47 may have one peak 48 in a region of 1.8 μm to 2.3 μm. As with the profile 43 of the n⁺ type buffer layer 29, the profile 47 may have at least two peaks.

Figure 5:
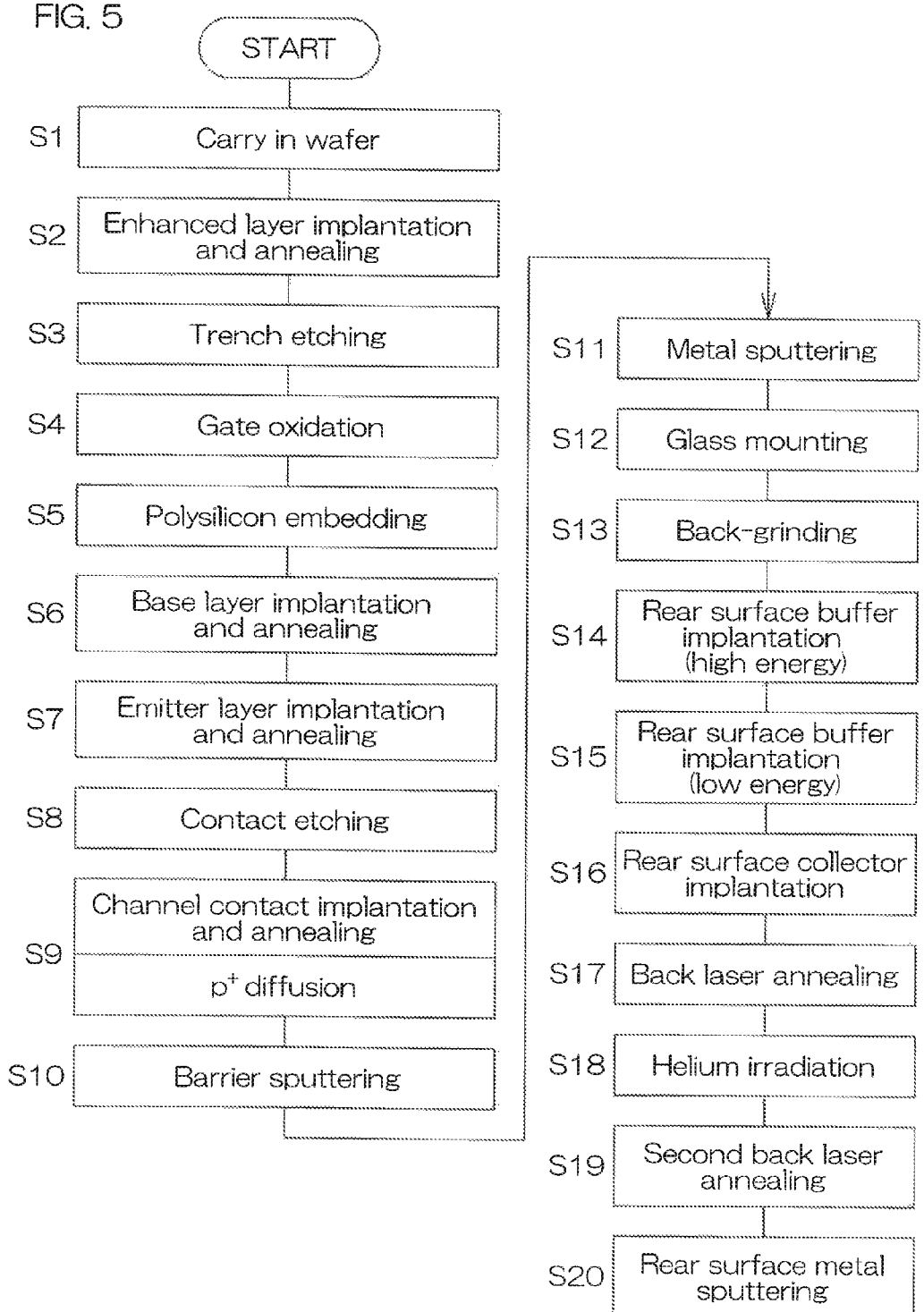
FIG. 5 is a diagram of a manufacturing flow of the switching element chip.

FIG. 5 is a diagram of a manufacturing flow of the switching element chip 2. A manufacturing process of the switching element chip 2 shall now be described in outline with reference to FIG. 3B and FIG. 5.

To manufacture the switching element chip 2, first, a semiconductor wafer, which is to constitute the semiconductor substrate 27 is prepared (step S1). Although the semiconductor wafer (silicon wafer) to be used may be either an epitaxial wafer or an FZ wafer, an FZ wafer is preferable from a standpoint of realizing low VCE (sat) and high speed switching. With an FZ wafer, a carrier concentration gradient is small, electron current components of high mobility increase, and therefore a large current can be made to flow with a small number of carriers.

Next, an n type impurity (for example, P (phosphorus)) is implanted into an entirety of the front surface of the semiconductor substrate 27 and then made to diffuse by a subsequent annealing processing to form the n type enhanced layer 31 in the semiconductor substrate 27 (step S2).

Next, the semiconductor substrate 27 (semiconductor wafer) is etched selectively to form the gate trenches 36 (step S3). Multiple unit cells 36 are thereby demarcated in the active region of the semiconductor substrate 27.

Next, the gate insulating films 37 are formed on inner surfaces of the gate trenches 36, for example, by a thermal oxidation method (step S4).

Next, the gate electrodes 25 are formed inside the gate trenches 36 by embedding an electrode material, such as polysilicon, etc., in the gate trenches 36 (step S5).

Next, a p type impurity (for example, B (boron)) is selectively implanted into the front surface of the semiconductor substrate 27 and then made to diffuse by a subsequent annealing processing to form the p⁻ type base layer 32 in a front surface portion of the semiconductor substrate 27 (step S6).

Next, an n type impurity (for example, P (phosphorus)) is selectively implanted into the front surface of the semiconductor substrate 27 and then made to diffuse by a subsequent annealing processing to form the n⁺ type emitter layers 33 in a front surface portion of the p⁻ type base layer 32 (step S7).

Next, the semiconductor substrate 27 is selectively etched to form the contact trenches 38 in the respective unit cells 26 (step S8).

Next, a p type impurity (for example, B (boron)) is selectively implanted into bottom portions of the contact trenches 38 and then made to diffuse by a subsequent annealing processing to form the p⁺ type base contact layers 34 (step S9).

Next, the barrier metal 41 is formed, for example, by a sputtering method (step S10) and further, the emitter metal 15 is formed by the sputtering method (step S11).

Next, the semiconductor substrate 27 is mounted by an adhesive, etc., onto a supporting glass so that the rear surface side faces up (step S12) and the semiconductor substrate 27 is thinned from the rear surface side (step S13). The semiconductor substrate 27 may be thinned by grinding (back-grinding) to a certain thickness and thereafter thinning to a final thickness, and at the same time performing mirror finishing, by etching.

The next process is an implantation process of the n⁺ type buffer layer 29 and the p⁻ type collector layer 28. In this process, first, an n type impurity (for example, P (phosphorus)) is implanted with a first energy (for example, of approximately 1200 keV) from the rear surface side of the semiconductor substrate 27 (step S14) and in succession, the n type impurity is implanted with a second energy (for example, of approximately 600 keV) lower than the first energy (step S15). Further, from the rear surface side of the semiconductor substrate 27, a p type impurity (for example, B (boron)) is implanted, with an energy lower than that used for the n⁺ type buffer layer 29 (step S16).

After the implantation of the impurities, an annealing process (first annealing processing process) for activating the impurities inside the n⁺ type buffer layer 29 and the p⁻ type collector layer 28 is performed (step S17). The annealing processing may be performed, for example, by laser annealing (first laser annealing process) at an irradiation energy density (first energy density) of 1 J/cm² to 3 J/cm².

Next, particle irradiation for forming the defect layer 35 is performed from the rear surface side of the semiconductor substrate 27. In the present preferred embodiment, ⁴He is irradiated (step S18). Besides particles of ⁴He, the particles to be irradiated in this process may be particles of at least one type of element among ³He, H, P, F, Ar, As, Sb, and Si as mentioned above. Also, as an irradiation apparatus, for example, an ion implantation apparatus, a cyclotron, or a Van de Graaf generator may be used.

Next, an annealing process (second annealing processing process) for activating the helium is performed (step S19). The annealing processing is performed at a lower temperature than that of the annealing processing of the n⁺ type buffer layer 29 and the p⁻ type collector layer 28. More specifically, laser annealing (second laser annealing process) is performed at an irradiation energy density (second energy density) lower than the irradiation energy density used in the laser annealing of the n⁺ type buffer layer 29 and the p⁻ type collector layer 28. The irradiation energy density in the present process may, for example, be 0.1 J/cm² to 0.5 J/cm². The defect layer 35 is thereby formed inside the n⁻ type drift layer 30.

Thereafter, the collector metal 42 is formed on the rear surface of the semiconductor substrate 27, for example, by the sputtering method (step S20) and the semiconductor substrate 27 is diced to obtain the switching element chip 2.

Although a preferred embodiment of the present invention has been described above, the present invention may also be implemented in yet other modes.

For example, an arrangement in which the conductivity types of the respective semiconductor portions of the semiconductor device 1 are inverted may be adopted. That is, in the semiconductor device 1, a p type portion may be of an n type and an n type portion may be of a p type.

Also, the switching element chip 2 may include, not the trench gate type IGBT described above, but a planar gate type IGBT.

Besides the above, various design modifications may be made within the scope of the matters described in the claims.

EXAMPLES

Although the present invention shall now be described based on examples, the present invention is not restricted by the examples described below.

<Preparation of Trial Products>

First, as trial products to be used in characteristics comparisons described below, semiconductor devices according to Example 1 and Reference Examples 1, 2 and 3 were prepared.

(1) Example 1

The semiconductor device of Example 1 was arranged as a semiconductor device having the structure of FIG. 3A and FIG. 3B (substrate thickness=60 μm, gate trench pitch P₁=3.4 μm, gate trench depth D₁=2.3 μm) and with which the impurity concentration profile of the n⁺ type buffer layer 29 is the profile 43 (double peak) of FIG. 4.

(2) Reference Example 1

The semiconductor device of Reference Example 1 was arranged as a semiconductor device differing from the semiconductor device of Example 1 in that substrate thickness=70 μm, gate trench pitch P₁=7.0 μm, gate trench depth D₁=5.0 μm, and the impurity concentration profile of the n⁺ type buffer layer 29 is the profile 46 (single peak) of FIG. 4, and in not including the n type enhanced layer 31 and the defect layer 35.

(3) Reference Example 2

The semiconductor device of Reference Example 2 was arranged as a semiconductor device differing from the semiconductor device of Example 1 in not including the n type enhanced layer 31 and the defect layer 35.

(4) Reference Example 3

The semiconductor device of Reference Example 3 was arranged as a semiconductor device differing from the semiconductor device of Example 1 in not including the defect layer 35.

<Characteristics Evaluations>

(1) Withstand voltage, (2) VCE (sat) characteristics, (3) switching characteristics, and (4) efficiency characteristics of the semiconductor devices of Example 1 and Reference Examples 1, 2, and 3 were evaluated respectively. The results are shown in FIG. 6 to FIG. 12.

Figure 6:
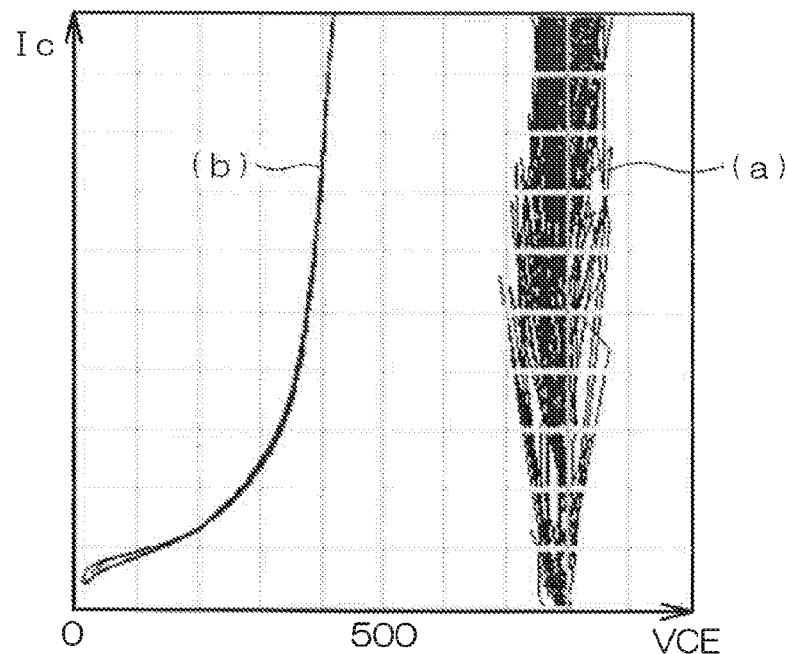
FIG. 6 is a diagram of results of withstand voltage evaluation of Reference Example 2.

FIG. 6 is a diagram of results of withstand voltage evaluation related to Reference Example 2 and shows results of observing the same device over time. With Reference Example 2, although gate trench pitch P₁=3.4 μm, gate trench depth D₁=2.3 μm, and substrate thickness=60 μm, the semiconductor device differs from the semiconductor device of Example 1 in not including the n type enhanced layer 31 and the defect layer 35. With Reference Example 2, oscillation is observed in the waveform at the point of breakdown as indicated by a solid line (a) in FIG. 6, the waveform of a solid line (b) of FIG. 6 is observed after the oscillation, and it was thus confirmed that element destruction occurs at the point of breakdown. It was thus clarified that sufficient destruction resistance at the point of breakdown is not obtained by only simply reducing the substrate thickness by approximately 15% from 70 μm to 60 μm.

Figure 7:
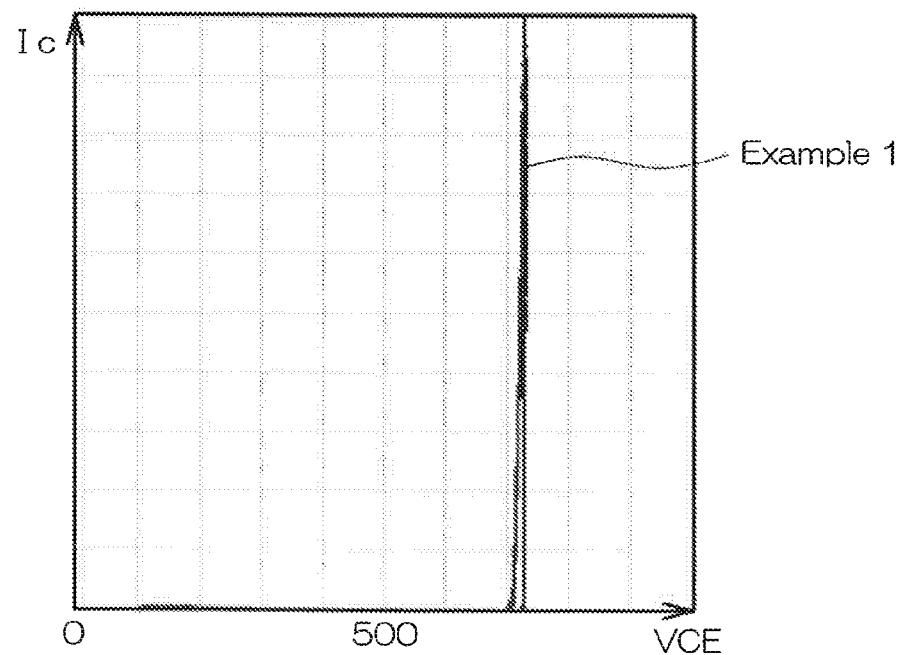
FIG. 7 is a diagram of results of withstand voltage evaluation of Example 1.

On the other hand, FIG. 7 is a diagram of results of withstand voltage evaluation of Example 1. According to FIG. 7, with Example 1, normal breakdown is observed at a voltage not less than 650V, which is a guaranteed withstand voltage. That is, it can be understood that by making the impurity concentration profile of the n⁺ type buffer layer 29 be of a double peak such as the profile 43 of FIG. 4, the withstand voltage can be maintained and the destruction resistance at the point of breakdown can be improved.

Figure 8:
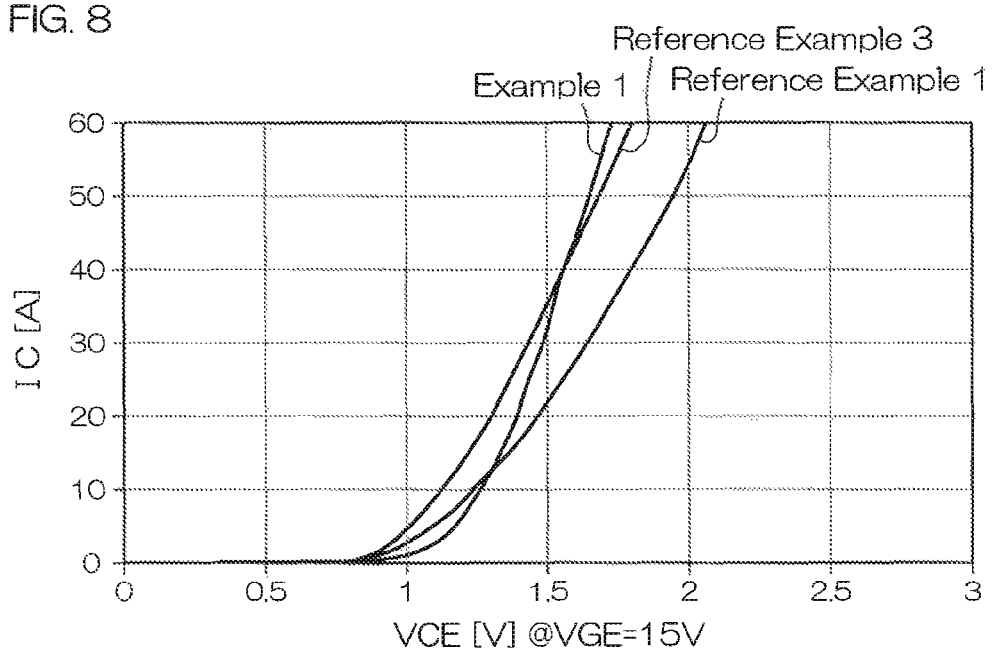
FIG. 8 is a diagram of VCE(sat) characteristics of Example 1 and Reference Examples 1 and 3.

FIG. 8 is a diagram of the VCE (sat) characteristics of Example 1 and Reference Examples 1 and 3. As shown in FIG. 8, it can be understood that with each of Example 1 and Reference Example 3, a low VCE(sat) is achieved in comparison to that of Reference Example 1. This is considered to be mainly a result of reducing the substrate thickness by approximately 15% and including the n type enhanced layer 31. On the other hand, with Example 1, although, unlike Reference Example 3, the defect layer 35 is formed in the n⁻ type drift layer 30, it was possible, regardless, to realize a low VCE(sat) substantially equivalent to that of Reference Example 3. This is considered to be because, unlike a structure where defects are generated in an entirety of wafer, as in a case of electron beam irradiation, and there are many unnecessary defects, the defect layer 35 is formed locally in the n⁻ type drift layer 30 based on the preferred embodiment described above.

Figure 9:
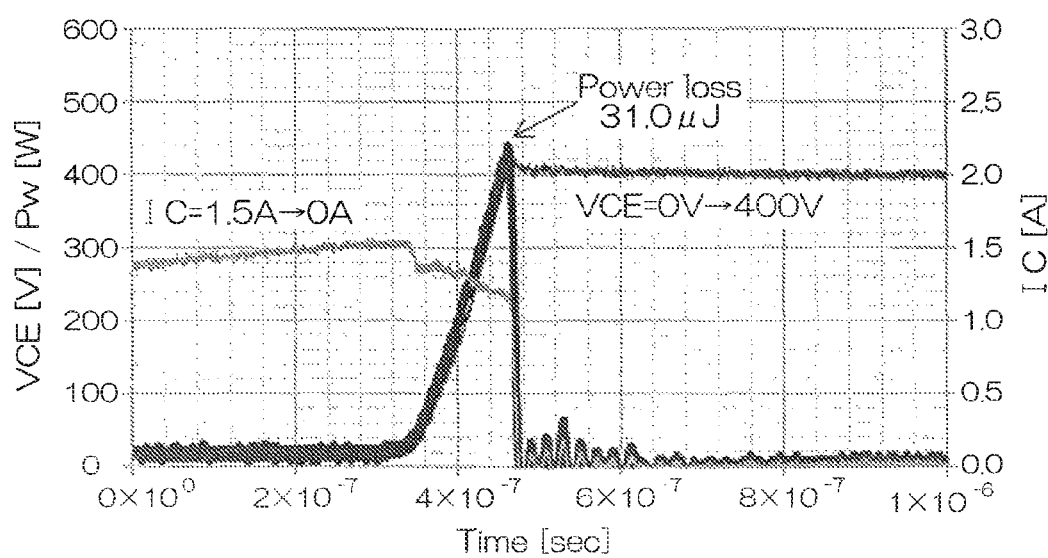
FIG. 9 is a diagram of switching characteristics of Example 1.
Figure 10:
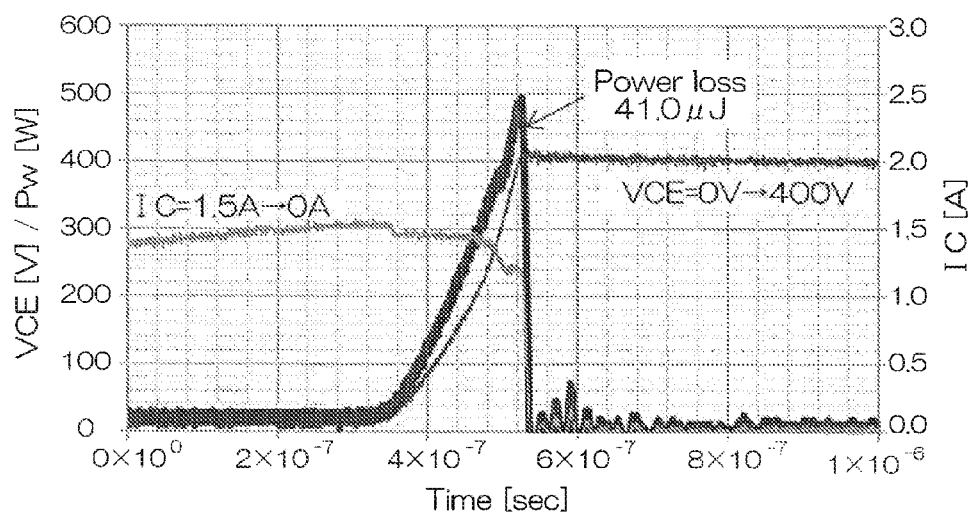
FIG. 10 is a diagram of switching characteristics of Reference Example 3.
Figure 11:
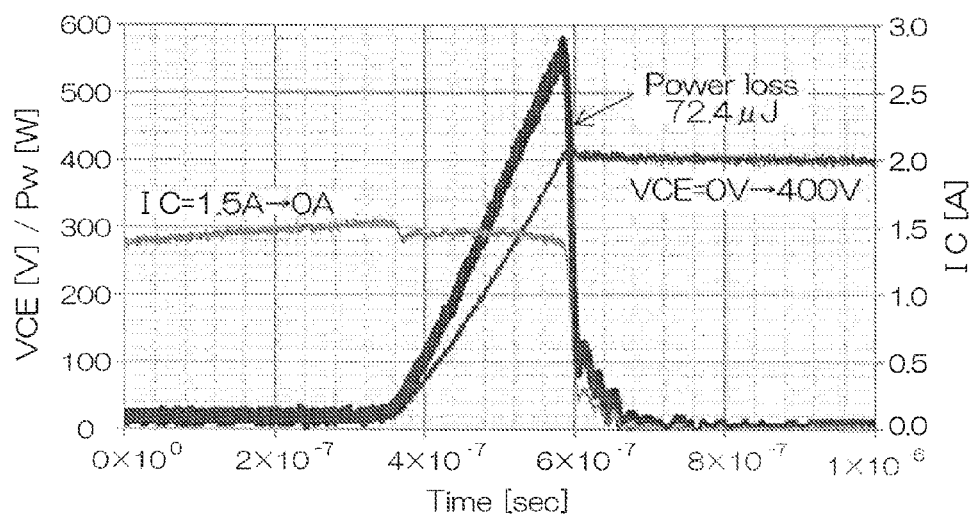
FIG. 11 is a diagram of switching characteristics of Reference Example 1.

The next evaluation is that of the switching characteristics of Example 1 and Reference Examples 1 and 3. FIG. 9 to FIG. 11 are diagrams of switching characteristics of Example 1, Reference Example 3, and Reference Example 1, respectively. First, from a comparison of FIG. 10 and FIG. 11, it can be understood that with Reference Example 3 of FIG. 10, power loss can be reduced by approximately 43% with respect to Reference Example 1 of FIG. 11. With Example 1 of FIG. 9, it was possible to reduce the power loss further by approximately 24% with respect to Reference Example 3 and reduce the power loss by approximately 57% with respect to Reference Example 1. This is considered to be because carrier life time control is achieved satisfactorily inside the n-type drift layer 30 due to the defect layer 35.

Figure 12:
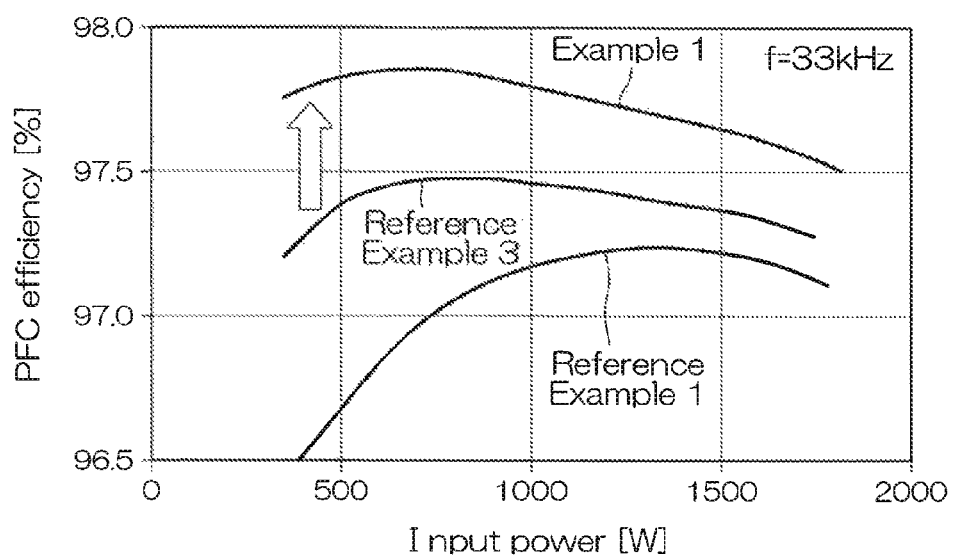
FIG. 12 is a diagram of efficiency characteristics of Example 1 and Reference Examples 1 and 3.
Figure 13:
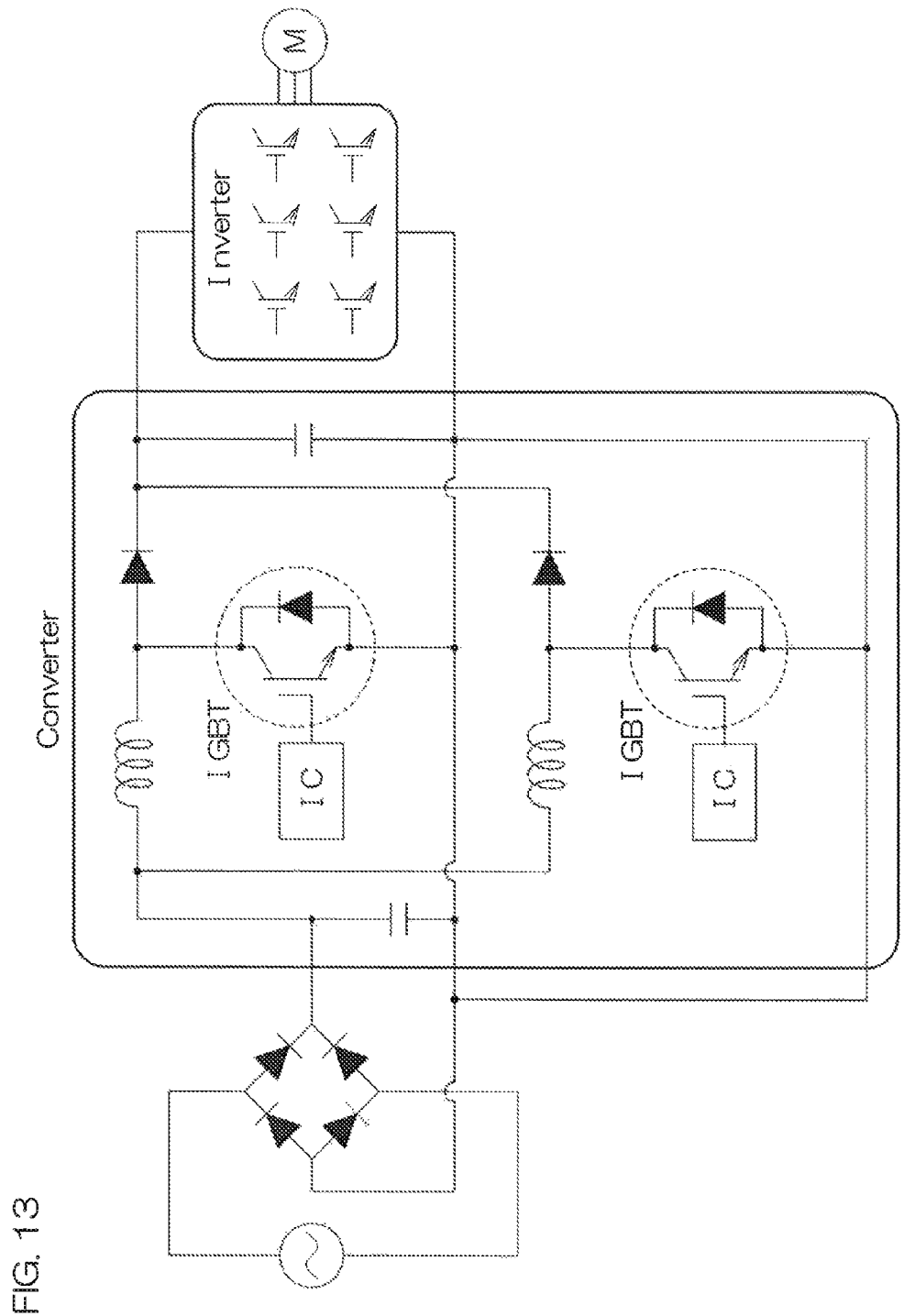
FIG. 13 is a diagram of a converter circuit used for evaluation of the efficiency characteristics.

FIG. 12 is a diagram of the efficiency characteristics of Example 1 and Reference Examples 1 and 3. In regard to the efficiency characteristic, each of the semiconductor devices of Example 1 and Reference Examples 1 and 3 was adopted as the IGBT of a converter circuit shown in FIG. 13 and a PFC (Power Factor Correction) efficiency was determined for each case. As shown in FIG. 12, with Reference Example 3, it was possible to improve the efficiency by approximately 0.8% over Reference Example 1, and with Example 1, it was possible to further improve the efficiency by approximately 0.35% over Reference Example 3 and improve the efficiency by approximately 1.15% over Reference Example 1.

What is claimed is:

1. A semiconductor device comprising:
   a semiconductor substrate, having an emitter layer of a first conductivity type, a collector layer of a second conductivity type and a drift layer of the first conductivity type sandwiched therebetween, the emitter layer disposed at a front surface side of the semiconductor substrate and the collector layer disposed at a rear surface side of the semiconductor substrate;
   a base layer of the second conductivity type between the drift layer and the emitter layer;
   a buffer layer of the first conductivity type between the collector layer and the drift layer, the buffer layer having an impurity concentration higher than that of the drift layer, and having an impurity concentration profile with two peaks in regard to a depth direction from the rear surface of the semiconductor substrate; and
   a defect layer, formed in the drift layer and having an impurity concentration profile with a half-value width of not more than 2 μm in regard to the depth direction from the rear surface of the semiconductor substrate.

2. The semiconductor device according to claim 1, wherein the defect layer contains at least one type of element among ⁴He, ³He, H, P, F, Ar, As, Sb, and Si.

3. The semiconductor device according to claim 1, wherein the defect layer is formed between 1 μm to 3 μm from the rear surface of the semiconductor substrate.

4. The semiconductor device according to claim 1, wherein the impurity concentration profile of the buffer layer has a first peak in a relatively shallow region from the rear surface of the semiconductor substrate and has a second peak of a lower impurity concentration than that of the first peak in a region relatively deeper than the first peak.

5. The semiconductor device according to claim 4, wherein the impurity concentration of the first peak is $2 \times 10^{16}$ cm⁻³ to $2 \times 10^{18}$ cm⁻³ and the impurity concentration of the second peak is $6 \times 10^{15}$ cm⁻³ to $6 \times 10^{17}$ cm⁻³.

6. The semiconductor device according to claim 1, wherein the semiconductor substrate has a thickness of 40 μm to 200 μm.

7. The semiconductor device according to claim 1, comprising:
   a gate trench, penetrating through the emitter layer and the base layer from the front surface of the semiconductor substrate and reaching the drift layer; and
   a gate electrode, embedded in the gate trench across a gate insulating film formed on an inner surface of the gate trench.

8. The semiconductor device according to claim 7, wherein the gate trench is formed in plurality at a pitch of 2 μm to 7 μm.

9. The semiconductor device according to claim 7, wherein the gate trench has a depth of 2 μm to 6 μm.

10. The semiconductor device according to claim 7, wherein the drift layer includes an enhanced layer, formed directly below the base layer and having a relatively higher impurity concentration than that of other regions of the drift layer.

11. The semiconductor device according to claim 1, wherein the semiconductor substrate includes a silicon substrate.

12. A method for manufacturing a semiconductor device comprising:
   a process of forming a base layer of a second conductivity type on a front surface portion of a semiconductor substrate of a first conductivity type having a drift layer and forming an emitter layer of the first conductivity type on a front surface portion of the base layer;
   a process of forming a buffer layer, having an impurity concentration higher than that of the drift layer and having an impurity concentration profile with two peaks in regard to a depth direction from a rear surface of the semiconductor substrate, by implanting, from the rear surface of the semiconductor substrate, a first conductivity type impurity with a first energy and then implanting the first conductivity type impurity with a second energy differing from the first energy;
   a process of forming a collector layer at a rear surface side of the semiconductor with respect to the buffer layer by implanting a second conductivity type impurity from the rear surface of the semiconductor substrate; and
   a process of forming, in the drift layer, a defect layer, having an impurity concentration profile with a half-value width of not more than 2 μm in regard to the depth direction from the rear surface of the semiconductor substrate, by irradiating the rear surface of the semiconductor substrate with particles of at least one type among ⁴He, ³He, H, P, F, Ar, As, Sb, and Si and performing annealing processing of the semiconductor substrate.

13. The method for manufacturing the semiconductor device according to claim 12, wherein the first energy is higher than the second energy.

14. The method for manufacturing the semiconductor device according to claim 12, comprising: a first annealing processing process of activating the impurities inside the buffer layer and the collector layer after the forming of the collector layer; and wherein the annealing processing when forming the defect layer includes a second annealing processing process of annealing-processing the semiconductor substrate at a lower temperature than that during the first annealing processing process.

15. The method for manufacturing the semiconductor device according to claim 14, wherein the first annealing processing process includes a first laser annealing process by laser irradiation having a first energy density, and
the second annealing processing process includes a second laser annealing process by laser irradiation having a second energy density lower than the first energy density.

16. The method for manufacturing the semiconductor device according to claim 15, wherein the first energy density is 1 $J/cm^2$ to 3 $J/cm^2$ and the second energy density is 0.1 $J/cm^2$ to 0.5 $J/cm^2$.

17. The method for manufacturing the semiconductor device according to claim 12, wherein the particles are irradiated by an ion implantation apparatus, a cyclotron, or a Van de Graaf generator.

* * * * *